(12) United States Patent
Hur et al.

(10) Patent No.: US 8,744,378 B2
(45) Date of Patent: Jun. 3, 2014

(54) LINC TRANSMITTER WITH IMPROVED EFFICIENCY

(75) Inventors: Joonhoi Hur, Dallas, TX (US); Rahmi Hezar, Allen, TX (US); Lei Ding, Plano, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 113 days.

(21) Appl. No.: 13/370,151

(22) Filed: Feb. 9, 2012

(65) Prior Publication Data

US 2013/0210376 A1 Aug. 15, 2013

(51) Int. Cl.
*H04B 1/04* (2006.01)

(52) U.S. Cl.
USPC ............... 455/114.2; 455/570; 455/114.1; 455/114.3; 455/296; 455/341; 330/52; 330/10; 330/251

(58) Field of Classification Search
USPC ............... 455/570, 91, 114.1, 114.2, 114.3, 455/127.3, 63.1, 501, 248.1, 278.1, 296, 455/341; 330/52, 10, 207 A, 251
See application file for complete search history.

(56) References Cited

U.S. PATENT DOCUMENTS

| 6,366,177 | B1 | 4/2002 | McCune et al. |
|---|---|---|---|
| 7,260,157 | B2 | 8/2007 | Hagh et al. |
| 2003/0107435 | A1 | 6/2003 | Gu |
| 2004/0101065 | A1 | 5/2004 | Hagh et al. |
| 2010/0176880 | A2 | 7/2010 | Dupuy et al. |
| 2011/0051842 | A1 | 3/2011 | Heijden et al. |
| 2011/0299634 | A1* | 12/2011 | Mirzaei et al. ............... 375/340 |
| 2012/0126887 | A1* | 5/2012 | Han et al. ..................... 330/53 |

FOREIGN PATENT DOCUMENTS

JP 2010268248 11/2010

OTHER PUBLICATIONS

U.S. Appl. No. 13/106,611, filed May 12, 2011.
"Asymmetric Multilevel Outphasing Architecture for Multi-standard Transmitters," 2009 IEEE Radio Frequency Integrated Circuits Symposium, pp. 237-240 (Chung, et al.).
"A Highly Efficient 1.95-GHz, 18-W Asymmetric Multilevel Outphasing Transmitter for Wideband Applications," Microwave Symposium Digest (MTT), 2011 IEEE MTT-S International, Jun. 5-10, 2011, pp. 1-4 (Godoy, et al.).

* cited by examiner

*Primary Examiner* — Tuan Pham
(74) *Attorney, Agent, or Firm* — Alan A. R. Cooper; W. James Brady, III; Frederick J. Telecky, Jr.

(57) ABSTRACT

A radio frequency (RF) transmitter is provided. The RF transmitter includes first and second drivers that are configured to receive first and second sets of complementary RF signals. Restoration circuits are coupled to the first and second drivers, and a bridge circuit is coupled to the first and second restoration circuits. By having the restoration circuits and the bridge circuit, a common mode impedance and a differential impedance can be provided, where the common mode impedance is lower than the differential impedance.

16 Claims, 4 Drawing Sheets

LINC TRANSMITTER WITH IMPROVED EFFICIENCY

TECHNICAL FIELD

The invention relates generally to Linear Amplification with Nonlinear Components (LINC) transmitter and, more particularly, to a LINC transmitter with compensation circuits to improve efficiency.

BACKGROUND

Turning to FIGS. 1 and 2, an example of a conventional LINC transmitter 100 can be seen. In operation, a input signal S(t) (which has a varying envelope) is provided to the signal generator 102, which can be represented as:

$$S(t) = A(t)e^{i\theta(t)}, \qquad (1)$$

where A(t) is the signal envelope and θ(t) is the signal phase. The signal generator 102 is then able to generate signals $S_1(t)$ and $S_2(t)$ from signal S(t), which can be represented as:

$$\begin{aligned}S(t) &= \frac{1}{2}(S_1(t) + S_2(t)) \\ &= \frac{c}{2}(e^{i(\theta(t)+\varphi(t))} + e^{i(\theta(t)-\varphi(t))}) \\ &= ce^{i\theta(t)}\left(\frac{e^{i\varphi(t)}+e^{-i\varphi(t)}}{2}\right) \\ &= ce^{i\theta(t)}\cos(\varphi(t)),\end{aligned} \qquad (2)$$

where c is radius shown in FIG. 2 and φ(t) is the out-phasing angle. When combining equations (1) and (2) and solving for the out-phasing angle φ(t), it becomes:

$$\varphi(t) = \arccos\left(\frac{A(t)}{c}\right). \qquad (3)$$

Since the arccosine function is limited to a domain between −1 and 1, then:

$$c \geq \max(A(t)), \qquad (4)$$

which means that the signals $S_1(t)$ and $S_2(t)$ have a generally constant envelope. As a result, high-efficiency, nonlinear power amplifiers (PAs) can be used as PAs 104-1 and 104-2 to generate signals $O_1(t)$ and $O_2(t)$, which can then be combined with combiner 106 to produce signal O(t) that has a variable envelope.

One issue with LINC transmitter 100 is that there is an efficiency loss (due in part to combiner 106), so, as an alternative, an Asymmetric Mutlilevel Outphasing (AMO) transmitter 200 can be employed, as shown in FIG. 3. In operation, the AMO modulator 202 (which generally includes predistortion that is adjusted by the predistortion trainer 212) generates amplitude signals AMP-1 and AMP-2 and phase signals φ-1 and φ-2 from input amplitude signal AMP and input phase signal φ. The phase signals φ-1 and φ-2 are provided to the digital-to-radio-frequency phase converter (DRFPC) 204 that produces generally constant envelope signals for PAs 208-1 and 208-2 (similar to signals generator 102), and the amplitude signals AMP-1 and AMP-2 are used to control the power level applied to PAs 208-1 and 208-2 from supplies 206-1 and 206-2 to achieve higher efficiency. As shown in FIG. 4, the power is switched in regions where the probability distribution function (PDF) is the largest. This allows the AMO transmitter 200 to have greater overall efficiency than the conventional LINC transmitter 100 and a multilevel LINC (ML-LINC) transmitter but less overall efficiency than an power added efficiency (PAE). Because the efficiency of the AMO transmitter 200 is still relatively low, however, there is a need for an RF transmitter with improved efficiency.

Some examples of conventional circuits are: Chung et al. "Asymmetric Multilevel Outphasing Architecture for Multistandard Transmitters," 2009 *IEEE Radio Frequency Integrate Circuits Symposium*, pp. 237-240; Godoy et al., "A Highly Efficient 1.95-GHz, 18-W Asymmetric Multilevel Outphasing Transmitter for Wideband Applications," *Microwave Symposium Digest (MTT), 2011 IEEE MTT-S International*, Jun. 5-10, 2011, pp. 1-4; U.S. Pat. No. 6,366,177; and U.S. Pat. No. 7,260,157.

SUMMARY

An embodiment of the present invention, accordingly, provides an apparatus. The apparatus comprises a first driver that is configured to receive a first set of complementary radio frequency (RF) signals; a second driver that is configured to receive a second set of complementary RF signals; a first restoration circuit that is coupled to the first driver; a second restoration circuit that is coupled to the second driver; a bridge circuit that is coupled to the first and second restoration circuits; and an output circuit that is coupled to the first and second restoration circuits, wherein the first restoration circuit, the second restoration circuit, and the bridge circuit provide a common mode impedance and a differential impedance, wherein the common mode impedance is lower than the differential impedance.

In accordance with an embodiment of the present invention, the first and second restoration circuits further comprise first and second inductor-capacitor (LC) circuits.

In accordance with an embodiment of the present invention, the apparatus further comprises: a first cancellation circuit that is coupled to the first driver; and a second cancellation circuit that is coupled to the second driver, wherein the first and second cancellation circuits increase peak efficiency.

In accordance with an embodiment of the present invention, the bridge circuit further comprises an inductor that is coupled between the first and second restoration circuits.

In accordance with an embodiment of the present invention, there is a free-fly interval between consecutive pulses from the first set of RF pulses and between consecutive pulses from the second set of RF pulses, and wherein at least one of the first and second cancellation circuits are configured to provide harmonic restoration during each free-fly interval.

In accordance with an embodiment of the present invention, the first and second cancellation circuits further comprise third and fourth LC circuits.

In accordance with an embodiment of the present invention, the output circuit further comprises a combiner.

In accordance with an embodiment of the present invention, an apparatus is provided. The apparatus comprises a signal generator that is configured to receive an input signal and that is configured to generate a plurality of sets of complementary RF signals; a plurality of drivers that are coupled to the signal generator, wherein each driver is configured to receive at least one of the sets of complementary RF signals; a plurality of restoration circuits, wherein each restoration circuit is coupled to at least one of the drivers; a bridge circuit that is coupled to each of the restoration circuits; and an output circuit that is coupled to each restoration network, wherein the plurality of restoration circuits and the bridge circuit provide a common mode impedance and a differential impedance, wherein the common mode impedance is lower than the differential impedance.

In accordance with an embodiment of the present invention, each restoration circuit further comprises an LC circuit.

In accordance with an embodiment of the present invention, the apparatus further comprises a plurality of cancellation circuits, wherein each cancellation circuit is coupled to at least one of the drivers, and wherein the plurality of cancellation circuits increases peak efficiency.

In accordance with an embodiment of the present invention, the bridge circuit further comprises an inductor that is coupled between the plurality of restoration circuits.

In accordance with an embodiment of the present invention, an apparatus is provided. The apparatus comprises a signal generator that is configured to receive an input signal and that is configured to generate first, second, third, and fourth RF signals, wherein the input signal has a variable envelope, and wherein the first and second RF signals are complementary, and wherein the third and fourth RF signals are complementary, and wherein there is a free-fly interval between consecutive pulses of the first, second, third, and fourth RF signals; a first driver having: a first transistor having a first passive electrode, a second passive electrode, and a control electrode, wherein the control electrode of the first transistor is coupled to the signal generator so as to receive the first RF signal; and a second transistor having a first passive electrode, a second passive electrode, and a control electrode, wherein the control electrode of the second transistor is coupled to the signal generator so as to receive the second RF signal, and wherein the first passive electrode of the second transistor is coupled to the second passive electrode of the first transistor at a first node; a second driver having: a third transistor having a first passive electrode, a second passive electrode, and a control electrode, wherein the control electrode of the third transistor is coupled to the signal generator so as to receive the third RF signal; and a fourth transistor having a first passive electrode, a second passive electrode, and a control electrode, wherein the control electrode of the fourth transistor is coupled to the signal generator so as to receive the fourth RF signal, and wherein the first passive electrode of the fourth transistor is coupled to the second passive electrode of the third transistor at a second node; a first restoration circuit that is coupled to the first node; a second restoration circuit that is coupled to the second node; an output circuit that is coupled to the first and second restoration circuits at third and fourth nodes, respectively; and a bridge circuit that is coupled to the third and fourth nodes, wherein the first restoration circuit, the second restoration circuit, and the bridge circuit provide a common mode impedance and a differential impedance, wherein the common mode impedance is lower than the differential impedance.

In accordance with an embodiment of the present invention, the first and third transistors further comprise first and second PMOS transistors, respectively, and wherein the second and fourth transistors further comprise first and second NMOS transistors, respectively.

In accordance with an embodiment of the present invention, the bridge circuit further comprises an inductor that is coupled to the third and fourth nodes.

In accordance with an embodiment of the present invention, the inductor further comprises a first inductor, and wherein the first restoration circuit further comprises: a second inductor that is coupled between the first and third nodes; and a first capacitor that is coupled between the first and third nodes; and wherein the second restoration circuit further comprises: a third inductor that is coupled between the second and fourth nodes; and a second capacitor that is coupled between the second and fourth nodes.

In accordance with an embodiment of the present invention, the apparatus further comprises: a first cancellation circuit that is coupled to the first node; and a second cancellation circuit that is coupled to the second node.

In accordance with an embodiment of the present invention, the first cancellation circuit further comprises a third capacitor and a fourth inductor coupled in series with one another, and wherein the second cancellation circuit further comprises a fourth capacitor and a fifth inductor coupled in series with one another.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
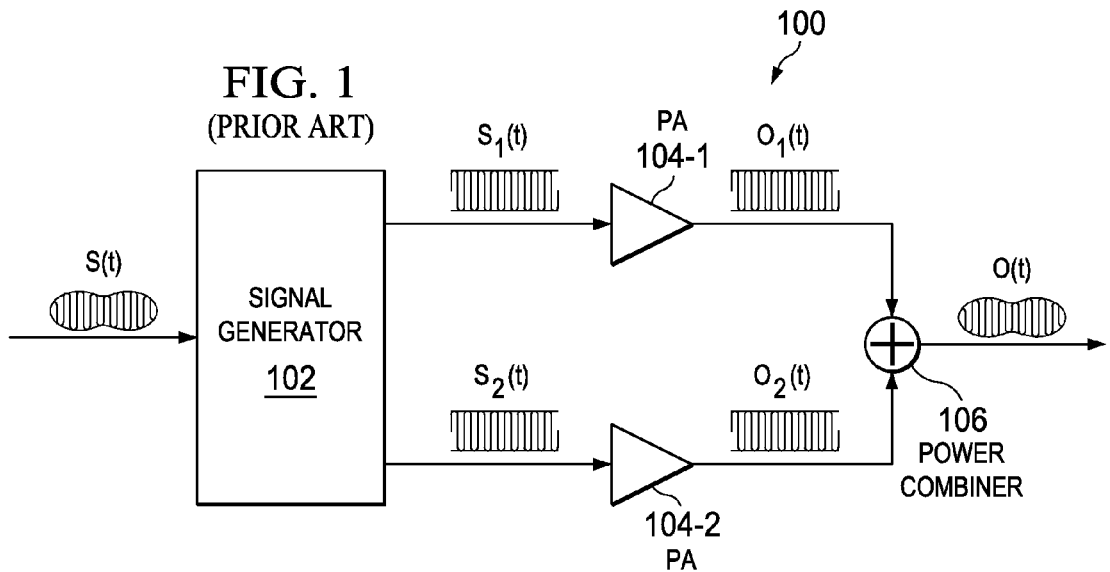
FIG. 1 is a diagram of an example of a conventional LINC transmitter.

Refer now to the drawings wherein depicted elements are, for the sake of clarity, not necessarily shown to scale and wherein like or similar elements are designated by the same reference numeral through the several views.

Figure 5:
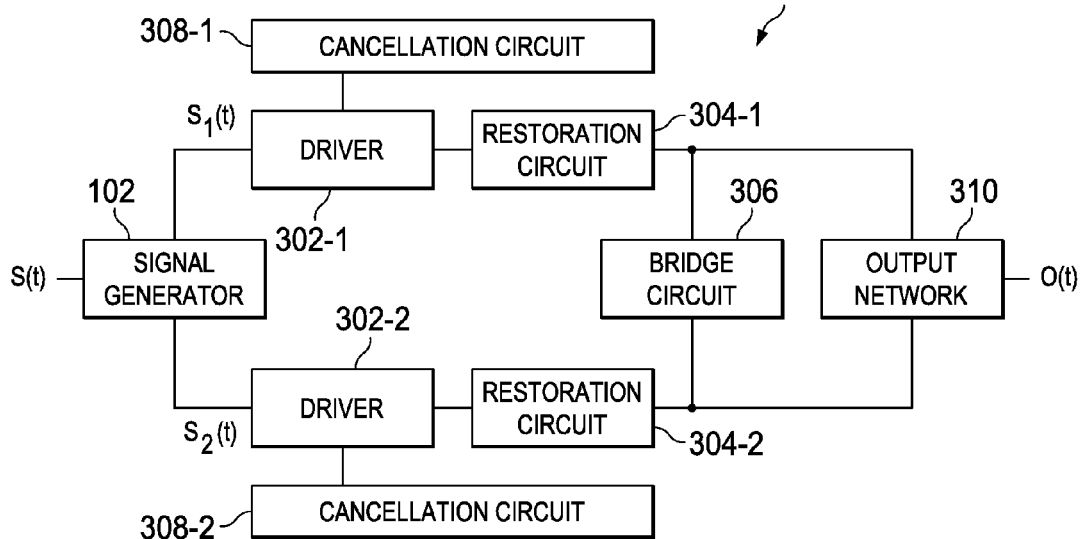
FIG. 5 is a diagram of an example of a LINC transmitter in accordance with the present invention.

Turning to FIG. 5, an example of a LINC transmitter 300 in accordance with the present invention can be seen. LINC transmitter 300 has a similar operation to LINC transmitter 100 in that it employs a signal generator 102 to produce signals $S_1(t)$ and $S_2(t)$ (which have a generally constant envelope) from signal S(t) (which has a variable envelope). These signal $S_1(t)$ and $S_2(t)$, for LINC transmitter 300, are then applied to drivers 302-1 and 302-2 so as to generate signal O(t) from output network 310 (which can include, for example, an inductor-capacitor network having capacitors CM1 and CM2 and inductor LM in FIG. 6). This output signal O(t) can then be applied to an radio frequency load (i.e., resistor RL of FIG. 6), such as an antenna. To improve the performance of the LINC transmitter 300 compared to other conventional transmitters, cancellation circuits 308-1 and 308-2, restoration circuits 304-1 and 304-2, and bridge circuit 306 are employed.

Figure 6:
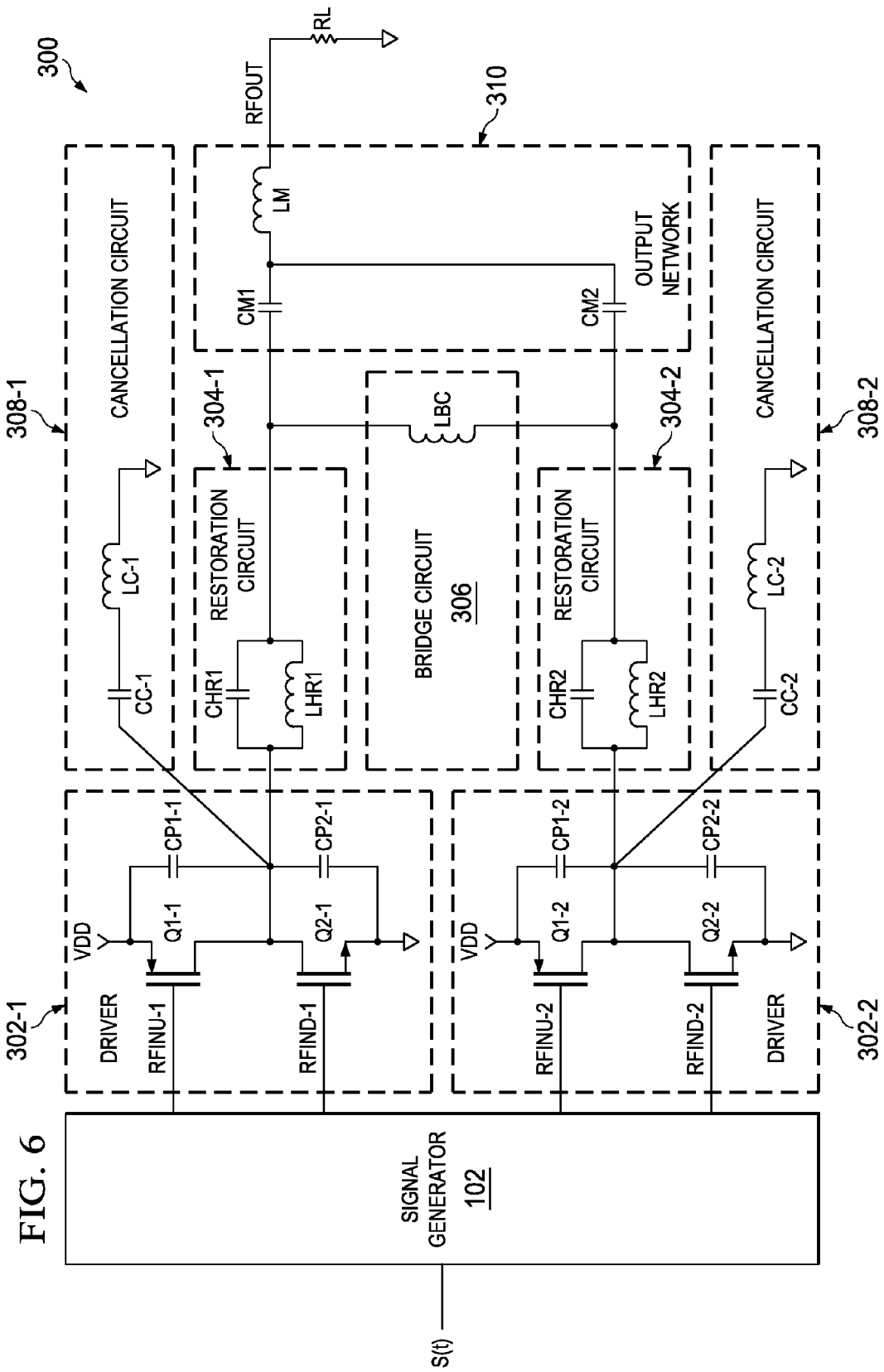
FIG. 6 is a more detailed example of the LINC transmitter of FIG. 5.

In FIG. 6, a more detailed example of the LINC transmitter 300 can be seen, which can assist in illustrating how the cancellation circuits 308-1 and 308-2 can improve performance. As shown, the drivers 302-1 and 302-2 are comprised of transistors Q1-1, Q2-1, Q1-2, and Q2-2 (where transistors Q1-1 and Q1-2 are shown to be PMOS transistors and transistors Q2-1 and where Q2-2 are shown to be NMOS transistors) having parasitic capacitances CP1-1, CP2-1, CP1-2, and CP2-2, respectively. These transistors Q1-1, Q2-1, Q1-2, and Q2-2 are, respectively, driven by RF input signal pairs RFINU-1/RFIND-1 and RFINU-2/RFIND-2 (which generally correspond to signals $S_1(t)$ and $S_2(t)$). This signal pairs RFINU-1/RFIND-1 and RFINU-2/RFIND-2 are generally complementary pulse width modulated (PWM) input signals that are able to activate transistors Q1-1/Q2-1 and Q1-2/Q2-2, but for transmitter 300, these signals are not "adjacent" to one another, meaning that these signals are truly complementary from a timing perspective. Between consecutive pulses for the signal pairs RFINU-1/RFIND-1 and RFINU-2/RFIND-2, there is a free-fly or dead time interval, meaning that there is an interval between consecutive activations of transistors Q1-1 and Q2-1 in driver 302-1 and between consecutive activations of transistors Q1-2 and Q2-2 in driver 302-2. As a result of using this free-fly interval, cancellation circuits 308-1 and 308-2 (which are generally comprised of inductor-capacitor circuits CC-1/LC-1 and CC-2/LC-2) can then control the harmonic content at the output of drivers 302-1 and 302-2 by providing a cancellation current as described in co-pending U.S. patent application Ser. No. 13/106,611, which is entitled "CLASS D POWER AMPLIFIER" and which is incorporated by reference herein. Essentially, the cancellation circuit 308-1 and 308-2 can provide harmonic restoration with its provision of the cancellation current that allows for an increase in peak efficiency.

With the restoration circuits 304-1 and 304-2 and bridge circuit 306, these circuits can vary the impedance of the transmitter 300 so as to increase the back-off efficiency. As shown, the restoration circuits 304-1 and 304-2 are generally comprise capacitors CHR1 and CHR2 and inductors LHR1 and LHR2, and the restoration circuits 304-1 and 304-2 are typically tuned (i.e., capacitors CHR1 and CHR2 and inductors LHR1 and LHR2 are properly dimensioned) to isolate the third harmonic (although tuning to other harmonics may also be possible) to generally function as a harmonic rejection filter. The bridge circuit 306, as shown, is generally comprised of an inductor LBC that is tuned or dimensioned to "tune-out" the effects of the parasitic capacitors CP1-1, CP2-1, CP1-2, and CP2-2 at the first harmonic (although other harmonics may be chosen).

Figure 2:
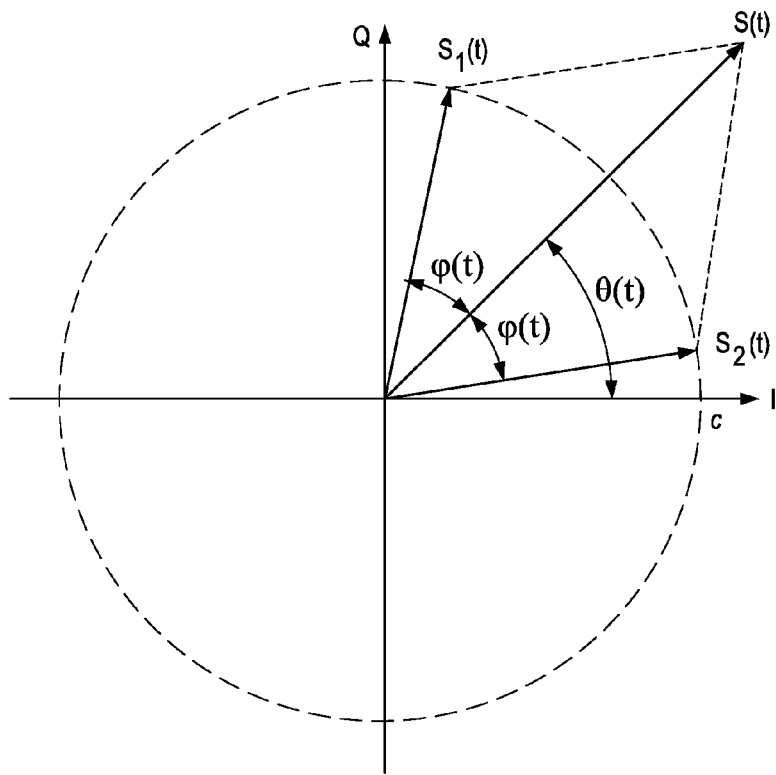
FIG. 2 is a vector diagram for the LINC transmitter of FIG. 1.
Figure 3:
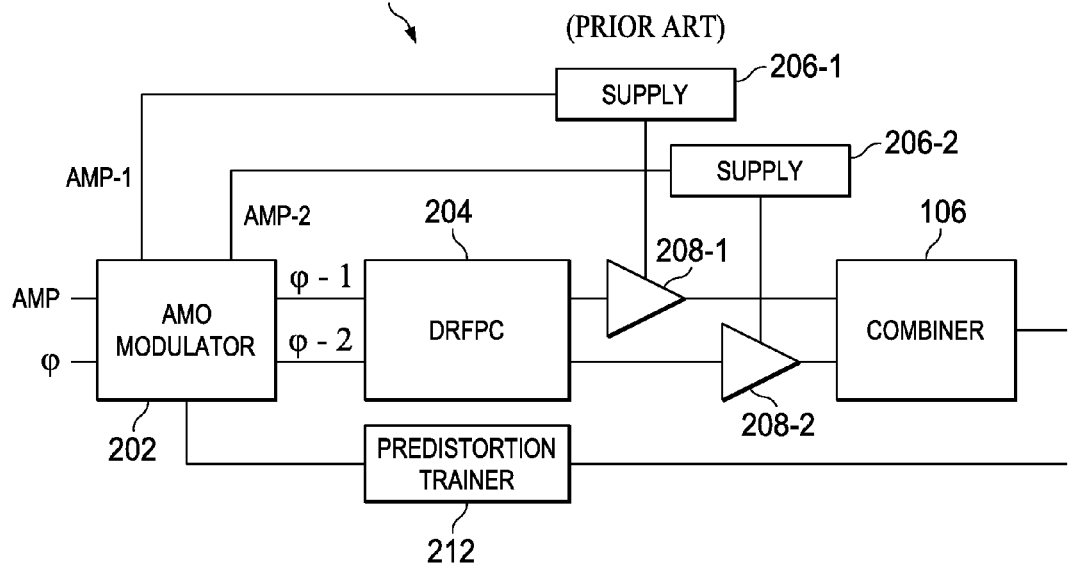
FIG. 3 is a diagram of an example of a conventional AMO transmitter.
Figure 4:
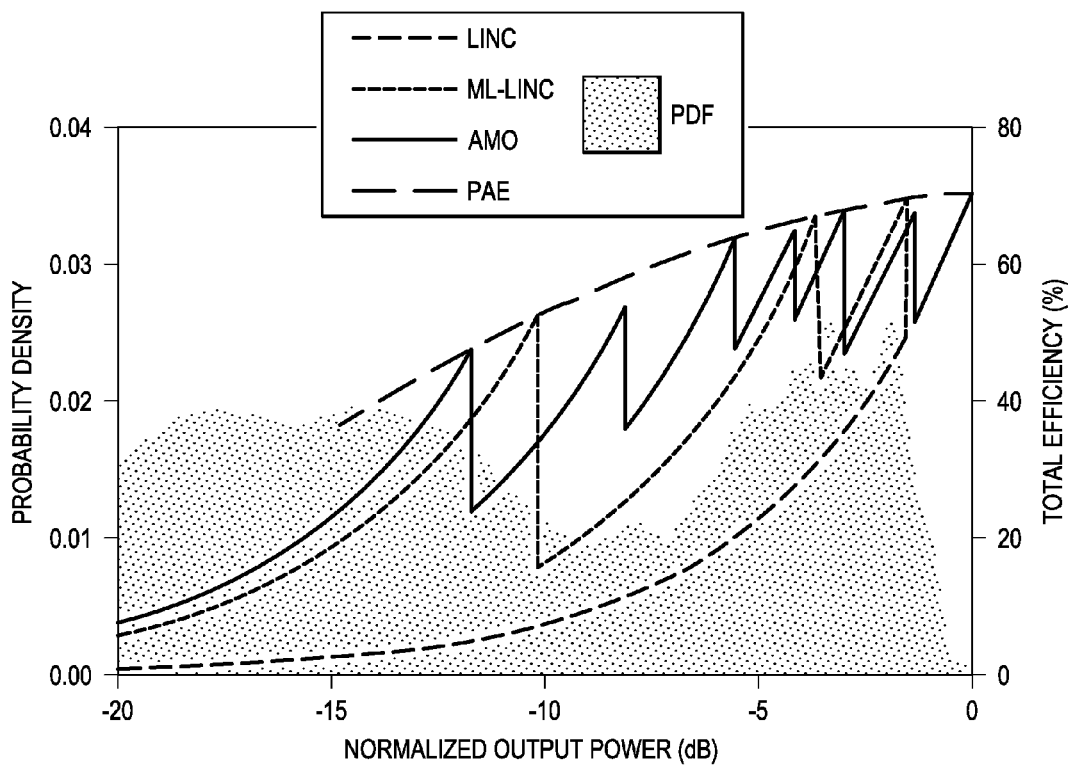
FIG. 4 is a diagram illustrating the efficiency of the LINC transmitter of FIG. 1 and the AMO transmitter of FIG. 3.

Looking back to the vector diagram of FIG. 2 for transmitter 100 (which would be similar to a vector diagram for transmitter 300), the vectors representing each of the signals $S_1(t)$ and $S_2(t)$ has both an out-of-phase component and an in-phase component that combine to form the vector representing signal S(t). To achieve higher total efficiency, it is desirable to have a higher impedance for the out-of-phase components (which can be referred to as the differential impedance) because the higher impedance lowers the current drawn. It is also desirable to have a lower impedance for the in-phase components (which can be referred to as the common mode impedance) because there is a decrease in the switching losses for transmitter 300. By having the restoration circuits 304-1 and 304-2 tuned to the third harmonic (for example) and having the bridge circuit 306 tuned to the first harmonic (for example), there can be a high differential impedance and a low common mode impedance, allowing for lower power consumption and increase efficiency.

Figure 7:
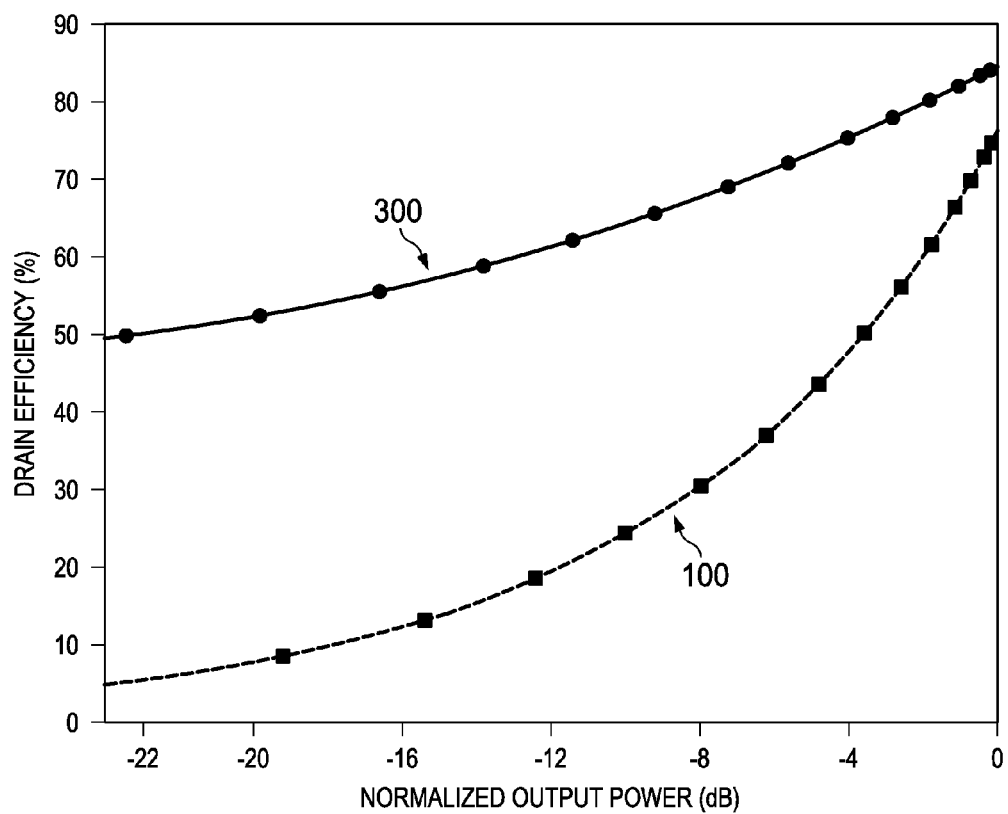
FIG. 7 is a diagram depicting the efficiency of the LINC transmitter of FIG. 6 compared to the LINC transmitter of FIG. 1.

With the combined use of cancellation circuits 308-1 and 308-2, restoration circuits 304-1 and 304-2, and bridge circuit 306 in transmitter 300, an efficiency improvement can be seen as compared to transmitter 100 in FIG. 7. As shown, there is nearly a 50% increase in efficiency at low power and about a 10% increase at high power. This improvement can also be achieved with passive components (i.e., resistors, capacitors, and inductors), avoiding the costs and penalties associated with other active systems (like AMO transmitter 200). Additionally, a bulky combiner (as used with transmitter 100) can also be eliminated.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first driver that is configured to receive a first set of complementary radio frequency (RF) signals;
   a second driver that is configured to receive a second set of complementary RF signals;
   a first restoration circuit that is coupled to the first driver;
   a bridge circuit that is coupled to the first and second restoration circuits;
   a second restoration circuit that is coupled to the second driver; and
   an output circuit that is coupled to the first and second restoration circuits, wherein the first restoration circuit, the second restoration circuit, and the bridge circuit provide a common mode impedance and a differential impedance, wherein the common mode impedance is lower than the differential impedance,
   a first cancellation circuit that is coupled to the first driver; and
   a second cancellation circuit that is coupled to the second driver, wherein the first and second cancellation circuits increase peak efficiency
   wherein the first and second restoration circuits further comprise first and second inductor-capacitor (LC) circuits.

2. The apparatus of claim 1, wherein the bridge circuit further comprise an inductor that is coupled between the first and second restoration circuits.

3. The apparatus of claim 2, wherein there is a free-fly interval between consecutive pulses from the first set of RF pulses and between consecutive pulses from the second set of RF pulses, and wherein at least one of the first and second cancellation circuits are configured to provide harmonic restoration during each free-fly interval.

4. The apparatus of claim 3, wherein the first and second cancellation circuits further comprise third and fourth LC circuits.

5. The apparatus of claim 4, wherein the output circuit further comprises a combiner.

6. An apparatus comprising:
a signal generator that is configured to receive an input signal and that is configured to generate a plurality of sets of complementary RF signals;
a plurality of drivers that are coupled to the signal generator, wherein each driver is configured to receive at least one of the sets of complementary RF signals;
a plurality of restoration circuits, wherein each restoration circuit is coupled to at least one of the drivers;
a bridge circuit that is coupled to each of the restoration circuits; and
an output circuit that is coupled to each restoration network, wherein the plurality of restoration circuits and the bridge circuit provide a common mode impedance and a differential impedance, wherein the common mode impedance is lower than the differential impedance,
wherein the apparatus further comprises a plurality of cancellation circuits, wherein each cancellation circuit is coupled to at least one of the drivers, and wherein the plurality of cancellation circuits increases peak efficiency,
wherein the first and second restoration circuits further comprise first and second inductor-capacitor (LC) circuits.

7. The apparatus of claim 6, wherein the bridge circuit further comprise an inductor that is coupled between the plurality of restoration circuits.

8. The apparatus of claim 7, wherein there is a free-fly interval between consecutive pulses from each set of RF pulses, and wherein at least one of the plurality of cancellation circuits is configured to provide harmonic restoration during each free-fly interval.

9. The apparatus of claim 8, wherein the output circuit further comprises a combiner.

10. An apparatus comprising:
a signal generator that is configured to receive an input signal and that is configured to generate first, second, third, and fourth RF signals, wherein the input signal has a variable envelope, and wherein the first and second RF signals are complementary, and wherein the third and fourth RF signals are complementary, and wherein there is a free-fly interval between consecutive pulses of the first, second, third, and fourth RF signals;
a first driver having:
a first transistor having a first passive electrode, a second passive electrode, and a control electrode, wherein the control electrode of the first transistor is coupled to the signal generator so as to receive the first RF signal; and
a second transistor having a first passive electrode, a second passive electrode, and a control electrode, wherein the control electrode of the second transistor is coupled to the signal generator so as to receive the second RF signal, and wherein the first passive electrode of the second transistor is coupled to the second passive electrode of the first transistor at a first node;
a second driver having:
a third transistor having a first passive electrode, a second passive electrode, and a control electrode, wherein the control electrode of the third transistor is coupled to the signal generator so as to receive the third RF signal; and
a fourth transistor having a first passive electrode, a second passive electrode, and a control electrode, wherein the control electrode of the fourth transistor is coupled to the signal generator so as to receive the fourth RF signal, and wherein the first passive electrode of the fourth transistor is coupled to the second passive electrode of the third transistor at a second node;
a first restoration circuit that is coupled to the first node;
a second restoration circuit that is coupled to the second node;
an output circuit that is coupled to the first and second restoration circuits at third and fourth nodes, respectively; and
a bridge circuit that is coupled to the third and fourth nodes, wherein the first restoration circuit, the second restoration circuit, and the bridge circuit provide a common mode impedance and a differential impedance, wherein the common mode impedance is lower than the differential impedance.

11. The apparatus of claim 10, wherein the first and third transistors further comprise first and second PMOS transistors, respectively, and wherein the second and fourth transistors further comprise first and second NMOS transistors, respectively.

12. The apparatus of claim 11, wherein the bridge circuit further comprises an inductor that is coupled to the third and fourth nodes.

13. The apparatus of claim 12, wherein the inductor further comprises a first inductor, and
wherein the first restoration circuit further comprises:
a second inductor that is coupled between the first and third nodes; and
a first capacitor that is coupled between the first and third nodes; and
wherein the second restoration circuit further comprises:
a third inductor that is coupled between the second and fourth nodes; and
a second capacitor that is coupled between the second and fourth nodes.

14. The apparatus of claim 13, wherein the apparatus further comprises:
a first cancellation circuit that is coupled to the first node; and
a second cancellation circuit that is coupled to the second node.

15. The apparatus of claim 14, wherein the first cancellation circuit further comprises a third capacitor and a fourth inductor coupled in series with one another, and wherein the second cancellation circuit further comprises a fourth capacitor and a fifth inductor coupled in series with one another.

16. The apparatus of claim 15, wherein the output circuit further comprises a combiner.

* * * * *